United States Patent [19]

Dougherty, Jr. et al.

[11] 4,053,942

[45] Oct. 11, 1977

[54] DEVICE FOR REMOVING LOW LEVEL CONTAMINANTS FROM A LIQUID

[75] Inventors: William E. Dougherty, Jr., Wappingers Falls; Lawrence V. Gregor, Hopewell Junction; Donald L. Klein; Thomas F. Redmond, both of Poughkeepsie; Morton D. Reeber, Shrub Oak, all of N.Y.

[73] Assignee: IBM Corporation, Armonk, N.Y.

[21] Appl. No.: 700,653

[22] Filed: June 28, 1976

[51] Int. Cl.² .............................................. H05K 7/20
[52] U.S. Cl. ...................................... 361/385; 357/82; 174/14 R
[58] Field of Search ................ 210/180; 219/271–276; 361/385; 357/82; 174/14 R, 15 R

[56] References Cited

U.S. PATENT DOCUMENTS 4,000,509  12/1976  Jarvela ................................. 357/82

OTHER PUBLICATIONS

IBM Tech. Discl. Bull., vol. 18, No. 7, Dec. 1975, p. 2228, Preventing Overshoot in Liquid Cooled Circuit Device, Anolick and Covaleski.

Primary Examiner—Gerald P. Tolin
Attorney, Agent, or Firm—Wolmar J. Stoffel

[57] ABSTRACT

A device for removing contaminant impurities, particularly contaminants existing at very low levels, from a liquid, including a heating element at least partially immersible in the liquid, a confinement means at least partially immersible in the liquid for maintaining a pulsating bubble of vapor of the liquid, the heating element located within the confining means, openings in the confining means to allow periodic partial escape of the vapor bubble and ingress of liquid.

8 Claims, 5 Drawing Figures

DEVICE FOR REMOVING LOW LEVEL CONTAMINANTS FROM A LIQUID

DISCUSSION OF THE PRIOR ART

This invention relates to removal of contaminants from liquids, principally contaminants existing at very low levers.

Contaminants in liquids present significant problems in many technologies. This is particularly true in the semiconductor industry where even trace impurities often make the difference between the success and failure. An example of the need for extreme liquid purity in the semiconductor technology is a liquid cooled integrated circuit semiconductor package. In this application, an integrated circuit device is mounted on a substrate and enclosed in a chamber along with a cooling liquid, typically a perfluorocarbon liquid. In operation, the heat generated by the operating device is removed by boiling of the liquid at the device-liquid interface. The resulting vaporization assists in the transfer of heat from the device and therefore maintains the device temperature at acceptable levels. The resultant vapor is condensed on the interior of the package enclosure surface. The cooling fluid can contain contaminants as it is obtained from the manufacturer. Contaminants can also be picked up from the device, the substrate, or the package assembly by the fluid after the assembly of the package. Depending on the contaminant, very serious damage can occur in the package over a period of time. For example, very small amounts of solder flux, which might be introduced into the fluid after a solder joining operation of the chip to the substrate will cause corrosion of the device and the substrate metallurgy. The corrosion will occur even with very small contaminant concentrations on the order of parts per million, which may be below even the level that can be measured or detected. In addition to the foregoing example, there are many other applications for liquids with low contaminant levels. There is thus a need for a suitable device which will remove contaminants, prior to using the liquid, or during actual use to maintain a low contaminant level.

SUMMARY OF THE INVENTION

It is an object of this invention to provide a means to remove impurities from a liquid wherein the impurities are present in the liquid at very low concentration levels.

Another object of this invention is to provide a method for purifying a liquid by removing contaminants.

Yet another object of this invention is to provide a new liquid cooled semiconductor package which includes a means for removing contaminants from the liquid.

Yet another object of this invention is to provide a device adapted to collect contamination from a liquid for inspection, detection, or analysis.

In accordance with the aforementioned objects, the present invention in its most basic form is a device to remove impurities from a liquid even when the impurities are present in very low concentration levels. The device has a heating element which is at least partially immersed in the liquid, a confinement means also immersed in the liquid for maintaining a pulsating bubble of vapor of the liquid, the heating element located within the confinement means, and openings in the confinement means to allow periodic partial escape of the vapor bubble and ingress of liquid.

DESCRIPTION OF THE PREFERRED EMBODIMENTS

Figure 1:
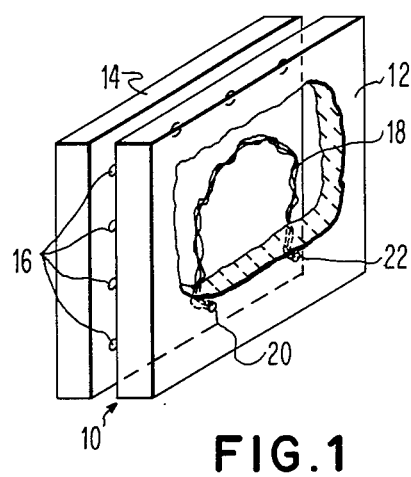
FIG. 1 is a perspective view of a preferred specific embodiment of the device for removing contaminants from a liquid.

Referring now to FIG. 1 of the drawings, there is illustrated a preferred specific embodiment of the invention for removing contaminants from a liquid. The device 10 has two spaced plates 12 and 14 formed of any suitable material as for example ceramic, thermoplastic, or any other suitable material that is relatively inert and is capable of withstanding temperatures above the boiling temperature of the liquid. The plates 12 and 14 are maintained in spaced relation with any suitable type of a spacing means which may include clamps, bolts, screws, etc. Preferably, the spacing is achieved by providing a plurality of solder joints 16 along the periphery of the plates. The solder bond 16 can be formed by the technique disclosed in U.S. Pat. No. 3,495,133. In general, the technology for forming the spacing solder mounds 16 is similar to that used to join semiconductor devices to a conductive metal pattern on a substrate. Solder wettable pads are formed on each of the plates 14 and 12 into a matching configuration, a layer of solder is formed on one or both of the pads, typically by evaporating a layer of solder through a mask, and the plates positioned and heated. The heating causes the solder to melt and the surface tension spaces the plates. The solder pads are formed on material that is not solder wettable. The spacing of the plates 12 and 14 is dependent on the viscosity of the fluid under consideration, the distance between solder bonds 16 and to some extent the size of the plates 12 and 14. The spacing of the plates and the requirements therein will be discussed in more detail in the description that follows. Located between plates 12 and 14 is a heating element 18 formed of any suitable type of material. A preferred material consists of a plurality of twisted strands of gold wire. Other materials can be used provided that the material is sufficiently inert so as not to provide a source of contamination. The ends of heating element 18 are passed through one of the plates 12 and secured to suitable terminals 20 and 22.

When a twisted wire is used as a heating element and looped in the manner indicated in FIG. 1, the wire inherently provides the proper spacing of the plates. The loop of wire in combination with plates 12 and 14 provides the enclosure for containing a pulsating vapor bubble of the liquid. The vapor exits through the twisted wire. Suitable means, to secure the plates together, as for example solder joints 16, is provided. The spacing of the joints 16 need not be such to form a pervious enclosure for the vapor bubble since the wire performs this function.

Figure 2:
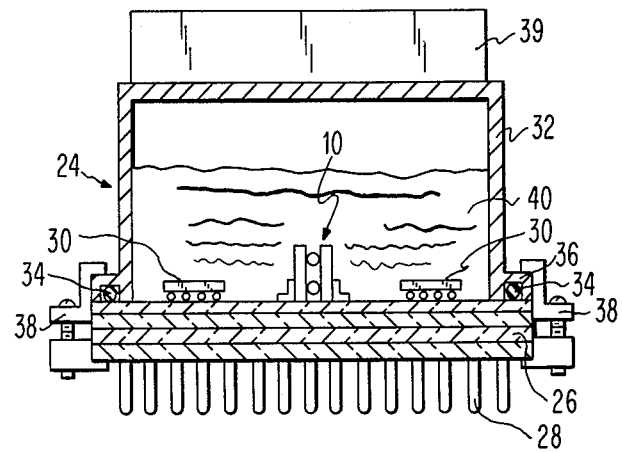
FIG. 2 is an elevational view in broken section illustrating the combination of the invention of a liquid cooled integrated semiconductor package and a device for removing contaminants from the cooling liquid.

In FIG. 2 is illustrated the combination of the gettering element 10 and a liquid cooled semiconductor package for integrated circuit devices. The package 24 consists of a substrate 26 preferably formed of multilayer ceramic sheets that have been punched, printed with patterns and sintered to form a unitary element in accordance with known technology as for example as discussed and disclosed in U.S. Pat. No. 2,966,719. Pins 28 are secured to the vias making an electrical connection to the circuitry within the substrate 26. On the top surface of substrate 26 are provided integrated circuit semiconductor devices 30 secured to the substrate by flip chip bonding technology. A cover 32 is positioned over the devices and a liquid tight seal made by a seal 34 in contact with the top surface of the substrate 26. The flange 36 is secured to the substrate 26 by a suitable clamping element 38. Fins 39 can be provided on the exterior of the cover 32. A cooling liquid 40, particularly perfluorocarbon, is introduced within the package. As indicated, the contamination gettering device 10 is immersed within the liquid 40. The terminals 20 and 22 of device 10 are connected to a power source which is sufficient to cause the element to heat up to a temperature sufficient to vaporize the liquid between the plates 12 and 14, causing a bubble to form.

Figure 3:
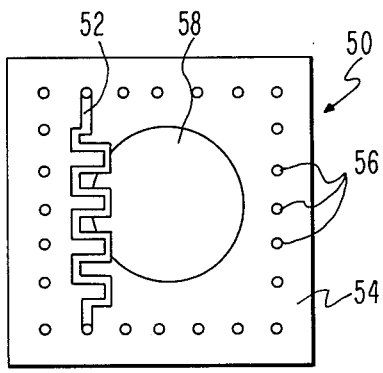
FIGS. 3 through 5 is a sequence of figures illustrating the interior of yet another preferred specific embodiment of the invention and the pulsating bubble of vapor mode of operation.
Figure 4:
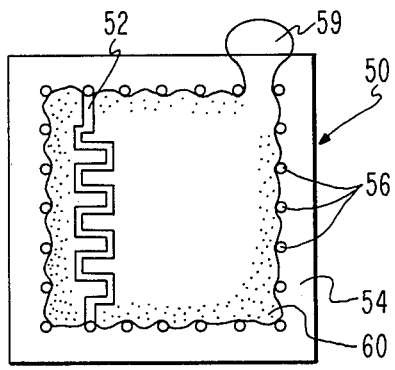
Figure 5:
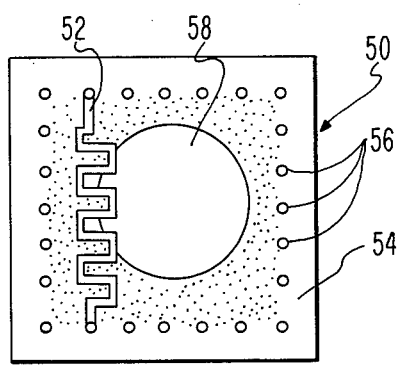

Referring now to FIGS. 3 through 5, there is illustrated another embodiment of the gettering device of the invention. In this embodiment 50, the heating element 52 is formed of a printed pattern of resistive material on substrate 54. About the periphery of the chip there is a row of solder joints 56 that, together with the substrates, form an enclosure about the heating element. As indicated in FIG. 3, when the device is placed in a fluid, liquid will enter the single space between the substrates flowing through the spaces between the solder joints 56. If desired, a larger spacing between joints 56 can be provided to release the vapor at a selected location. When power is applied to the heating element 52, a bubble 58 is formed of the vapor of the cooling liquid. As time progresses, the bubble expands but is held in place by the solder joints 56. As the vapor pressure of the bubble increases, a portion 59 of the bubble 58 is released as illustrated in FIG. 4. During the interval that the vapor bubble expands, contaminant material 60 deposits on the faces of the substrates. After the portion 59 of the vapor bubble has been released, the vapor bubble contracts to the approximate position as shown in FIG. 5. As the power to the heating element 52 is continued, the cycle repeats itself and additional contaminant matter is deposited on the surface of the substrates. Thus, the arrangement and mode of operation of the device produces a pulsating vapor bubble held in a confined space. It is theorized that the vapor bubble in expanding leaves a thin adherent film of the liquid on the plates which are preferably wettable to the liquid. This thin film of liquid is subsequently vaporized. Any particulate matter or contaminants not vaporized are deposited on the plates and thus taken out of the liquid.

The spacing of the plates or substrates of the device is governed by the type of liquid to be processed, i.e. the viscosity, the nature of the material of the plates, i.e. the wettability of the liquid on the plates, and the spacing of the solder joints when such are used. In actual use, the device can be set up and run continuously or intermittently. As for example, in an integrated circuit semiconductor package illustrated in FIG. 2, the device 10 can be run continuously, irrespective of whether or not the devices are actually operating.

While the invention has been particularly shown and described with reference to the preferred embodiments thereof, it will be understood by those skilled in the art that the foregoing and other changes in form and detail may be made therein without departing from the spirit and scope of the invention.

What is claimed is

1. In a liquid cooled semiconductor package assembly having at least one semiconductor device carrier substrate, at least one semiconductor device mounted on the substrate, a cover for forming an enclosure about said semiconductor device, and a cooling liquid in the enclosure adapted for cooling the device, the improvement comprising a means to trap and hold contaminants from said cooling liquid, said means including an electrical heating element immersed in the cooling liquid, and a confining means immersed in the cooling liquid and adapted to enclose and maintain a pulsating vapor bubble generated by said heating element, said heating element disposed within said confining means and at least partially immersed in said cooling liquid, means to permit controlled partial escape of a portion of the vapor bubble and ingress of cooling fluid to said confining means.

2. The assembly of claim 1 wherein said confining means is comprised of two flat, parallel, closely spaced elements located on opposite sides of said heating element.

3. The assembly of claim 1 wherein said cooling liquid is a fluoro-carbon liquid.

4. The assembly of claim 2 wherein said flat elements are spaced in the range of 2 to 11 mils.

5. The assembly of claim 4 wherein said heating element is a twisted wire.

6. The assembly of claim 4 wherein said plates are maintained in spaced relation with a plurality of solder mounds.

7. The assembly of claim 2 wherein said heating element is a printed line of resistive paste on one of said flat spaced elements.

8. The assembly of claim 2 wherein said flat spaced elements are ceramic substrates.

* * * * *